United States Patent [19]

Hirosaki et al.

[11] Patent Number: 4,642,575

[45] Date of Patent: Feb. 10, 1987

[54] PHASE-LOCKED LOOP WITH SUPPLEMENTAL PHASE SIGNAL

[75] Inventors: Botaro Hirosaki; Takashi Kuriyama, both of Tokyo, Japan

[73] Assignee: NEC Corporation, Tokyo, Japan

[21] Appl. No.: 805,536

[22] Filed: Dec. 6, 1985

[30] Foreign Application Priority Data

Dec. 6, 1984 [JP] Japan .................. 59-257842

[51] Int. Cl.⁴ ............................. H03L 7/06
[52] U.S. Cl. .................... 331/1 A; 375/120
[58] Field of Search .............. 331/1 A, 10, 17, 25; 375/120

[56] References Cited

U.S. PATENT DOCUMENTS 4,535,459 8/1985 Hogge, Jr. ................ 375/120 X

OTHER PUBLICATIONS

Halgren et al., "Improved Acquisition in Phase-Locked Loops with Sawtooth Phase Detectors", IEEE Transactions on Communications, vol. COM-30, No. 10, Oct. '82.

Primary Examiner—Eugene R. LaRoche
Assistant Examiner—David Mis
Attorney, Agent, or Firm—Sughrue, Mion, Zinn, Macpeak, and Seas

[57] ABSTRACT

A phase-locked loop is supplied with a random two-level code sequence derived from a clock pulse having a frequency $f_0$ to generate a local clock pulse which is in phase and frequency synchronization with the clock pulse. The local clock pulse is supplied by means of a voltage control oscillator controlled in accordance with a phase difference signal and a phase supplement signal. The phase difference signal is indicative of the difference in phase between an input signal and a discrimination signal. The phase supplement signal is derived by a signal generator responsive to the phase difference signal and the local clock pulses.

5 Claims, 9 Drawing Figures

PHASE-LOCKED LOOP WITH SUPPLEMENTAL PHASE SIGNAL

BACKGROUND OF THE INVENTION

The present invention relates to a phase-locked loop circuit which is supplied with a random two-level code sequence derived from a clock pulse having a frequency $f_0$ to generate a local clock pulse which is synchronous with the clock pulse in phase and frequency.

A phase-locked loop (PLL) is often needed in, for example, the timing circuit built into the receive section of a data modem, and the timing circuit built into the repeater which is used in pulse code modulation (PCM) communication systems. Recently, this type of PLL has also come to be used in the timing circuit of a device designed to retrive data from a digital recording medium.

A PLL of the type described is supplied with a random two-level code sequence and is provided with a different configuration from the ordinary PLL which serves to synchronize a local clock pulse with an externally supplied clock pulse. Specifically, where the input signal to the PLL is a clock pulse which is supplied from the outside, a phase difference between the input signal and the local clock pulse is detectable by, for example, taking the exclusive-OR of the input signal and the local clock pulse so that phase-locking may be accomplished by controlling a voltage controlled oscillator (VCO) responsive to the phase difference. However, where the input signal is a random two-level code sequence, the exclusive-OR output of the input signal and the local clock pulse fluctuates due to the statistical characteristic of the two-level code sequence, preventing an accurate phase difference from being detected.

Heretofore, various approaches have been proposed to eliminate the drawback which is particular to such an ordinary PLL as discussed. One approach is the PLL described by Ross C. Halgren in a paper entitled "Improved Acquisition in Phase-Locked Loops with Sawtooth Phase Detectors", IEEE Transactions on Communications, Vol. COM-30, No. 10, October 1982. However, the PLL scheme described in this paper has the disadvantage that when a pattern having a repetition frequency of $f_0/4$ arrives, a signal whose frequency is one half the frequency of a local clock pulse necessarily appears at an output terminal to practically disable the control of the phase-locking.

SUMMARY OF THE INVENTION

It is therefore an object of the present invention to provide a PLL which solves the above-discussed problematic situation and is controllable without regard to the kind of input signal.

In accordance with the present invention, there is provided a phase-locked loop to which a random two-level code sequence derived from a clock signal having a predetermined frequency is applied as an input signal. A voltage controlled oscillator generates a local clock signal. In response to the local clock pulse, a discriminator latches the input signal to produce a discrimination signal. An exclusive-OR gate produces a first phase difference signal from the input signal and the discrimination signal. A phase supplement signal generator, responsive to the first phase difference signal and the local clock pulse, produces a phase supplement signal. Responsive to the first phase difference signal and the phase supplement signal, a control signal generator produces a control signal to control the voltage controlled oscillator.

The above and other objects, features, and advantages of the present invention will become more apparent from the following detailed description when taken with the accompanying drawings.

DESCRIPTION OF THE PREFERRED EMBODIMENT

Figure 1:
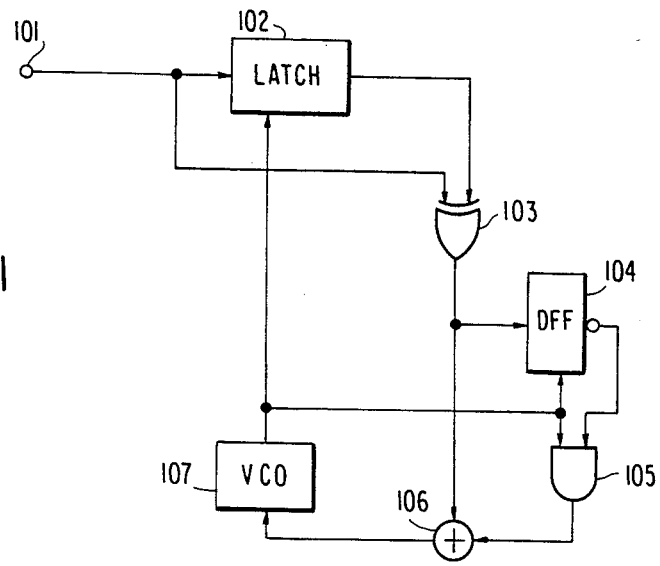
FIG. 1 is a block diagram of a PLL embodying the present invention.
Figure 2A:
FIGS. 2A to 2H show waveforms demonstrating the operation of the PLL shown in FIG. 1.
Figure 2B:
Figure 2C:
Figure 2D:
Figure 2E:
Figure 2F:
Figure 2G:
Figure 2H:

Referring to FIGS. 1 and 2A–2H, a random two-level code sequence (FIG. 2B) which is derived from a clock (FIG. 2A) at the transmission side is applied to a latch circuit or discrimination circuit 102 and an exclusive-OR gate 103. The latch circuit 102 latches the two-level code sequence in response to rising edges of local clock pulses (FIG. 2C) which are generated by a voltage controlled oscillator (VCO) 107. The exclusive-OR gate 103 performs an exclusive-OR operation in response to the output of the latch circuit 102 (FIG. 2D) and the two-level code sequence, thereby producing a phase difference signal (FIG. 2E) indicative of the phase difference between the transmission clock pulse and the local clock pulse. As shown in FIG. 2E, at least when a data transition has occurred, a phase difference between the transmission clock pulse and the local clock pulse is detected. However, the waveform shown in FIG. 2E includes those low-level sections 1001–1004 which have no phase difference information and which develop as a result of the absence of data transitions. Hence, if the phase difference signal is directly applied to a VCO as a control signal, the control of the VCO will be inaccurate due to the absence of phase difference information in those low-level sections. In accordance with the present invention, a phase supplement signal generator is provided for generating a phase supplement signal (FIG. 2G) which supplements the phase difference information associated with the low-level sections concerned, using the phase difference signal of FIG. 2E. The phase supplement signal generator comprises a D-type flip-flop 104, and an AND gate 105 for performing an AND operation on the output of the flip-flop 104 (FIG. 2F) and the local clock pulse. The phase supplement signal (FIG. 2G) outputted by the AND gate 105 is applied to an adder 106 to be added to the phase difference signal from the exclusive-OR gate 103 (FIG. 2H). The output of the adder 106 is fed to the VCO 107 as a control signal. The VCO 107, responsive to the phase difference output of the adder 106, controls the frequency of the local clock pulse such that the phase difference between the local clock pulse and the transmission clock pulse becomes zero.

As stated above, it will be seen that the present invention provides a PLL which performs all steps up to the detection of the absence of a data transition by a digital technique, and supplements the phase information in transition-lacking sections by analog addition. Hence, whatever the statistical characteristic of the input random two-level code sequence may be, a phase difference is positively detected at least when a data transition has occurred and phase information is positively supplemented in transition-lacking sections. This allows the PLL to be surely controlled at all times. in addition, since discrimination of the input signals and synchronization of the local clock pulse are implemented with a simple circuit arrangement such as shown in FIG. 1, the PLL of the present invention is feasible for large scale integration.

While the phase difference signal has been shown and described as being directly applied to a VCO, it may be routed thereto through a loop filter to be made smoother. This and other modifications to the circuit construction fall within the scope of the present invention.

Although the input signal has been represented by a two-level random sequence, it naturally covers other codes such as CMI codes and DMI codes which are extensively used in the optical communications field.

What is claimed is:

1. A phase locked loop to which a random two-level code sequence signal derived from clock pulses having a predetermined frequency is applied as an input signal, comprising:
    voltage controlled oscillator means for generating local clock pulses;
    discriminator means responsive to said local clock pulses for producing a discrimination signal;
    means for producing a first phase difference signal between the input signal and the discrimination signal;
    phase supplement signal generating means responsive to the first phase difference signal and the local clock pulses for producing a phase supplement signal; and
    means responsive to the first phase difference signal and the phase supplement signal for producing a control signal to control the voltage controlled oscillator.

2. A phase locked loop as claimed in claim 1, wherein said phase supplement signal generating means comprises a D-type flip-flop responsive to said first phase difference signal for producing a local signal, and an AND gate responsive to the local signal and the local clock pulses for producing said phase supplement signal.

3. A phase locked loop as claimed in claim 1, wherein said means responsive to the first phase difference signal and the phase supplement signal comprises an adder for summing these signals.

4. A phase locked loop as claimed in claim 1, wherein said discriminator means comprises a latch circuit for latching said two-level code sequence signal in synchronism with said local clock pulses.

5. A phase locked loop as claimed in claim 1, wherein said means for producing said first phase difference signal comprises an exclusive OR circuit receiving as inputs said two-level code sequence signal and said discrimination signal.

* * * * *